US008632851B1

(12) United States Patent
Ren et al.

(10) Patent No.: US 8,632,851 B1
(45) Date of Patent: Jan. 21, 2014

(54) METHOD OF FORMING AN I-II-VI$_2$ COMPOUND SEMICONDUCTOR THIN FILM OF CHALCOPYRITE STRUCTURE

(71) Applicant: Sun Harmonics Ltd, Hangzhou (CN)

(72) Inventors: Yuhang Ren, Hangzhou (CN); Zhi Huang, Hangzhou (CN); Paifeng Luo, Hangzhou (CN); Kai Shum, Hangzhou (CN)

(73) Assignee: Sun Harmonics Ltd, Hangzhou, Zhejiang (CN)

( * ) Notice: Subject to any disclaimer, the term of this patent is extended or adjusted under 35 U.S.C. 154(b) by 0 days.

(21) Appl. No.: 13/871,640

(22) Filed: Apr. 26, 2013

(51) Int. Cl.
 *B05D 5/12* (2006.01)
 *H05H 1/24* (2006.01)
 *H01L 21/06* (2006.01)

(52) U.S. Cl.
 USPC ............... 427/76; 427/569; 438/95; 438/102

(58) Field of Classification Search
 USPC ............ 427/74, 76, 569; 136/262, 264, 265; 438/95, 102
 See application file for complete search history.

(56) References Cited

U.S. PATENT DOCUMENTS

| | | | |
|---|---|---|---|
| 5,935,324 A | 8/1999 | Nakagawa et al. | |
| 8,012,546 B2 | 9/2011 | Ishizuka et al. | |
| 2007/0056843 A1* | 3/2007 | Ye et al. | 204/192.1 |
| 2008/0072962 A1* | 3/2008 | Ishizuka et al. | 136/264 |
| 2009/0050208 A1* | 2/2009 | Basol et al. | 136/264 |
| 2009/0215224 A1 | 8/2009 | Li et al. | |
| 2010/0078059 A1* | 4/2010 | Lee | 136/244 |
| 2010/0173482 A1 | 7/2010 | Chuang et al. | |
| 2011/0120373 A1 | 5/2011 | Bollman et al. | |
| 2012/0021556 A1 | 1/2012 | Beck et al. | |
| 2012/0067407 A1 | 3/2012 | Fujdala et al. | |
| 2012/0313200 A1 | 12/2012 | Jackrel et al. | |

FOREIGN PATENT DOCUMENTS

EP   1521308 A1   4/2005

OTHER PUBLICATIONS

CIGS thin films, solar cells, and submodules fabricated using a rfplasma cracked Se-radical beam source, Shogo Ishizuka et al. Thin Solid Films vol. 519, Issue 21, Aug. 31, 2011, pp. 7216-7220.
Development of Plasma-Assisted Processing for Selenization and Sulfurization of Absorber Layers, S. Kosaraju et al. 2003 MRS Spring Meeting.
Formation of chalcogen containing plasmas and their use in the synthesis of photovoltaic absorbers, Kosaraju, S. Journal of Vacuum Science & Technology A: Vacuum, Surfaces, and Films, Jul. 2005.

(Continued)

*Primary Examiner* — James Lin
(74) *Attorney, Agent, or Firm* — Lackenbach Siegel, LLP; Myron Greenspan

(57) ABSTRACT

A method of forming an compound semiconductor thin film of chalcopyrite structure includes the steps of heating up elemental VI powder in a first chamber to produce VI vapor flux. The VI vapor flow is introduced into a second chamber and an Argon plasma is utilized to crack large molecular VI fractions to generate small VI species. The small molecule VI species are homogeneously deposited on the metallic I-III precursor layers and the precursor film is sealed into a graphite box and transferred to an annealing chamber to create an absorber layer with a large grain size and good crystalline structure.

17 Claims, 7 Drawing Sheets

(56) References Cited

OTHER PUBLICATIONS

Monolithically integrated flexible Cu(In,Ga)Se2 solar cell submodules, Shogo Ishizuka et al. Solar Energy Materials and Solar Cells vol. 94, Issue 12, Dec. 2010, pp. 2052-2056.

Pulsed-Spray Radiofrequency Plasma Enhanced Chemical Vapor Deposition of CuInS2 Thin Films, Rene G. Rodriguez et al. Plasma Chemistry and Plasma Processing Apr. 2006, vol. 26, Issue 2, pp. 137-148.

Two-step selenization of Cu-In-Ga precursors for CIGS thin-film solar cells by using a Se cracker, Ho-Sub Lee et al. Journal of the Korean Physical Society May 2012, vol. 60, Issue 10, pp. 1753-1756.

Cu(In,Ga)Se2 thin-film solar cells grown with cracked selenium, Masahiro Kawamura et al. Journal of Crystal Growth vol. 311, Issue 3, Jan. 15, 2009, pp. 753-756.

Effect of Se flux on CuIn1-xGaxSe2 film in reactive sputtering process, Nae-Man Park et al. Progress in Photovoltaics: Research and Applications vol. 20, Issue 7, pp. 899-903, Nov. 2012.

Large grain Cu(In,Ga)Se2 thin film growth using a Se-radical beam source, Shogo Ishizuka et al. Solar Energy Materials and Solar Cells vol. 93, Issues 6-7, Jun. 2009, pp. 792-796.

Properties of different temperature annealed Cu(In,Ga)Se2 and Cu(In,Ga)2Se3.5 films prepared by RF sputtering, Yu, Zhou et al. Applied Surface Science, vol. 261, p. 353-359, Nov. 2012.

Reactive Sputtering Process for $CuIn_{1-x}Ga_xSe_2$ Thin Film Solar Cells, Nae-Man Park et al. ETRI Journal, vol. 34, No. 5, Oct. 2012.

\* cited by examiner

METHOD OF FORMING AN I-II-VI$_2$ COMPOUND SEMICONDUCTOR THIN FILM OF CHALCOPYRITE STRUCTURE

BACKGROUND OF THE INVENTION

1. Field of the Invention

This invention generally relates to a method of forming thin film semi-conductors and, more specifically, forming an I-III-VI$_2$ compound semiconductor thin film of chalcopyrite structure.

2. Description of the Prior Art

Semiconductor devices are devices that employ semiconductor materials, which are solid materials that exhibit an electrical conductivity lying between that of a conductor and that of an insulator. Semiconductor devices include, for example, diodes (e.g., light emitting diodes (LEDs)), photovoltaic devices, sensors, solid state lasers, and integrated circuits (e.g., memory modules and microprocessors).

Photovoltaic devices are semiconductor devices that convert photons (e.g. light) into electricity. For example, solar panels include photovoltaic devices that convert sunlight (i.e., photons originating from the sun) into electricity. Due to the ever-increasing demand for renewable energy sources, the market for photovoltaic devices has experienced an average annual growth rate of about twenty five percent (25%) over the previous decade.

Extensive research and development has resulted in photovoltaic materials and devices that are cheaper and more efficient. The cost of power produced by photovoltaic devices has decreased significantly over the past several decades, but must be further reduced to become competitive with alternative power sources, such as coal.

A majority of photovoltaic devices that are commercially available at the present time comprise photodiodes formed in silicon substrates. The performance of such silicon-based photovoltaic devices, is however, inherently limited by physical and chemical properties of silicon. New photovoltaic devices have been created that are based on light-absorbing materials (which may be either organic or inorganic) other than silicon. The number of non-silicon-based photovoltaic devices has steadily increased over the previous two (2) decades and currently accounts for over ten percent (10%) of the solar energy market. Non-silicon photovoltaic devices are expected to eventually replace a large portion of the market for silicon-based photovoltaic devices and to expand the solar energy market itself due to their material properties and efficient power generating ability. In order for solar power to be economically competitive with alternative fossil fuel power sources at their current prices, photovoltaic devices based on photoactive materials other than silicon must be improved and further developed.

Materials other than silicon that can be employed in photovoltaic devices include, for example, germanium (Ge), chalcopyrites (e.g., CuInS$_2$, CuGaS$_2$, and CuInSe$_2$), chalcogenides [Cu(In$_x$Ga$_{1-x}$)(Se$_y$S$_{1-y}$)$_2$], cadmium telluride (CdTe), gallium arsenide (GaAs), organic polymers (e.g. polyphenylene vinylene, copper phthalocyanine, fullerenes), and light absorbing dyes (e.g., ruthenium-centered metalorganic dyes). Photovoltaic devices based on such materials have demonstrated greater photon conversion efficiencies than those exhibited by silicon-based devices. Furthermore, some non-silicon photovoltaic devices are capable of capturing a broader range of electromagnetic radiation than silicon-based devices, and as such, may be more efficient in producing electrical power from solar energy than are silicon-based devices.

In particular, compound semiconductor material has attracted much attention most recently because of its application in high efficient photovoltaic devices. For example, chalcopyrite Cu(In,Ga)(S,Se)$_2$ (CIGS) thin film solar cells have reached up to 20.3% power conversion efficiency and show great application potential in photovoltaic devices. Decent conversion efficiency and high chemical stability of CIGS make it a promising p-type material for thin film solar cells. The most common vacuum-based process is to co-evaporate or co-sputter copper, gallium, and indium onto a substrate at room temperature, then anneal the resulting film with a selenide vapor to form the final CIGS structure. An alternative process is to co-evaporate copper, gallium, indium and selenium onto a heated substrate.

These multi-step fabrication techniques involve deposition and then a subsequent annealing in one or more steps in a group VIA or other reactive environment. In order to obtain a viable CIGS photovoltaic device, it is very critical to optimize the metallic precursor layers and choose a suitable selenization temperature profile and duration.

The Se supply and selenization environment is extremely important in determining the properties and quality of the film produced from precursor layers. When Se is supplied in the gas phase (for example as H$_2$Se or elemental Se) at high temperatures the Se will become incorporated into the film by absorption and subsequent diffusion. During this step, called chalcogenization, complex interactions occur to form a chalcogenide. These interactions include formation of Cu—In—Ga intermetallic alloys, formation of intermediate metal-selenide binary compounds, and phase separation of various stoichiometric CIGS compounds. Because of the variety and complexity of the reactions taking place, the properties of the CIGS film are difficult to control. When a selenium element is used in its solid powder form close to the metallic precursor layer, problems of heterogeneity of this element may arise. The big selenium molecule clusters impinge on the growth surface in the conventional evaporation based method. The thermal energy and chemical activity of these larger molecules are relatively low, which leads to the poor crystal quality of CIGS films.

Differences exist between films formed using different Se sources. Using H$_2$Se yields the fastest Se incorporation into the absorber; 50 at % Se can be achieved in CIGS films at temperatures as low as 400 C. By comparison, elemental Se only achieves full incorporation with reaction temperatures of 500° C. and above. Below 500° C. films formed from elemental Se were not only Se deficient, but also had multiple phases including metal selenides and various alloys. Use of H$_2$Se also provides the best compositional uniformity and the largest grain sizes. However, H$_2$Se is highly toxic and is classified as hazardous to the environment. It implies severe constrains on the mass production processes.

Moreover, IIIB element in depth of the initially deposited material is subsequently much different through the depth of the final semiconductor absorption layer after the selenization as much of IIIB element is pushed to bottom of the layer in the final semiconductor material.

Stephane et al., (U.S. Published Pat. Appl. No: US 2009-0130796 A1) describe a method for sulfurization and selenization of electrodeposited CIGS films by thermal annealing.

Serdar et al., (U.S. Pat. No. 8,153,469) disclose a method for forming CIGS solar cell absorber layer on continuous flexible substrates based on a two-stage process (metallic precursor layer deposition and S/Se high temperature annealing process).

Basol (U.S. Published Pat. Appl. No: US 2009-0130796 A1) discloses a method of and an apparatus for converting metallic precursor layers into CIGS solar cell absorbers on a surface of a flexible roll.

Rakesh et al., (U.S. Published Pat. Appl. No: US 2012-0122268 A1) describe a method of fabricating a CIGS nanocrystal precursor layer and selenizing the nanocrystal precursor layer in a selenium containing atmosphere.

Lakshmikumar and Rastogi (J. Appl. Phys. 76, 3068 (1994)) describe a plasma assisted two stage method of preparing selenide semiconductor thin film using elemental selenium vapor and vacuum evaporation technique.

Tao et al., (Chin. Phys. Lett. 27, 028101 (2010)) demonstrate a plasma-assisted selenization method of preparing $CuInSe_2$ films under different working pressures.

Ishizhuka et al., (U.S. Pat. No. 8,012,546) disclose a method of preparing semiconductor thin films by cracking selenium with plasma to generate radical selenium, and using the radical selenium in the process of forming the semiconductor film.

However, selenization processes involving selenium solid powders have suffered from the heterogeneity of Se element along the CIGS thin films. Although the use of $H_2Se$ has provided good compositional uniformity, $H_2Se$ is a highly toxic gas that requires severe constraints on the mass production processes. Also, all plasma assisted selenization methods are based on vacuum evaporation techniques that are also very limited in mass production processes.

SUMMARY OF THE INVENTION

The present invention eliminates the drawbacks of the known selenization techniques. For this purpose, the invention provides a method that incorporates a plasma generation unit into the chemical vapor deposition system to homogeneously deposit a selenium cap layer and to accelerate the reaction between precursors and Se vapor, therefore improving the crystallization of the CIGS absorber layer, in which:

a) Selenium vapor flux is generated in an independent thermal evaporator by heating elemental selenium up to 500° C.;

b) The Se gas is carried by Argon flow and transport through a piping system into the radio frequency (RF) activation chamber. The temperature for selenium flux and the piping system is kept above 300° C.;

c) Argon plasma is used to activate elemental selenium vapor. Large molecular selenium fractions are converted into highly reactive ionized small molecules selenium species by the interaction with the RF radiation in the plasma activation chamber;

d) The processed selenium vapor flow is led into the chemical vapor deposition chamber to deposit the selenium cap layer on the top of the CIG metallic precursors;

e) The selenium caped CIG precursor is placed into a graphite box and transferred to a heat treatment chamber for selenization under a designed temperature profile to form a p type CIGS absorber layer.

The present invention provides a method of producing a high quality CIGS absorber film. The thin films exhibit large grain size and modified surface morphologies and therefore a high efficiency CIGS photovoltaic device. The invention is suitable for mass production of CIGS photovoltaic modules.

BRIEF DESCRIPTION OF THE DRAWINGS

The accompanying drawings, which are incorporated in and form a part of the specification, illustrate preferred embodiments of the present invention, and together with the description, serve to explain the principles of the invention, in which.

DETAILED DESCRIPTION OF THE PREFERRED EMBODIMENT

Figure 1:
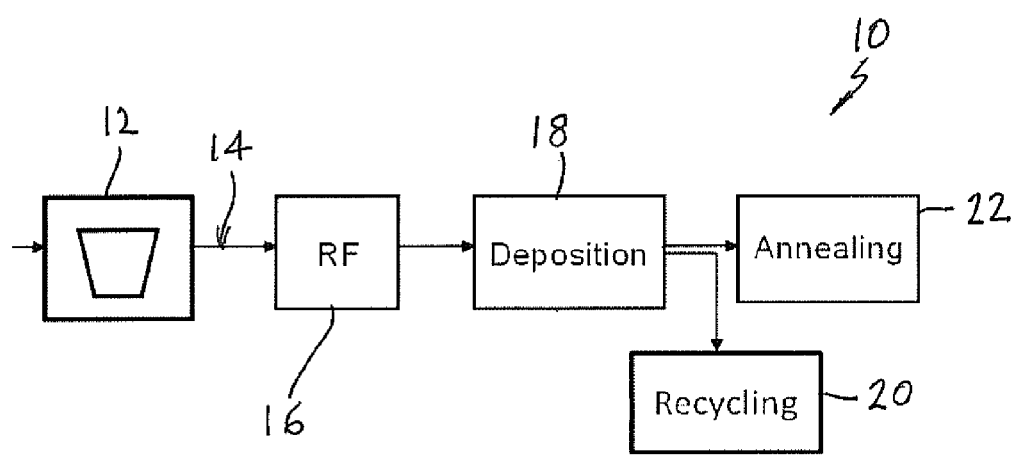
FIG. 1 is a schematic of the PECVD deposition system for carrying out the method of present invention to form a CIGS thin film.

Referring first to FIG. 1, a plasma enhanced chemical vapor deposition (PECVD) system 10 is shown for implementing the method of the present invention. The whole system 10 is evacuated by a vacuum pump thereby providing the desired vacuum level within the chamber. In accordance with the present invention, Se vapor is generated by heating solid Se, a VI element, powder within a first chamber in the form of a crucible 12 and the temperature of Se vapor 14 is maintained above 250° C. to produce a VI vapor flux by twining round thermal insulation. The VI vapor flow is directed into a second chamber utilizing an Argon plasma to crack large molecular VI fractions to generate small VI species. A PECVD reaction chamber 16 is provided for containing an RF plasma therein. A control panel is provided for controlling the various parameters of the plasma such as RF frequency, power and bias voltage. The Se vapor 14 is carried into the RF chamber by Argon flow which is from 100 sccm to 100 sccm. The Argon plasma is applied with a frequency in excess of 30 KHz. A gas mixture is provided for controlling the various parameters of the plasma deposition process such as reactant gas flow rates and dynamic reactant chamber pressure. Cracking of the larger molecules is conducted in the second chamber at a temperature in excess of 200° C. In a deposition chamber 18 high temperature of Se vapor is deposited onto the CIG precursor layer at room temperature. The small molecule VI species is homogeneously deposited on the metallic I-III CIG precursor layers. Pressure in excess of 150 mTorr is maintained in the reaction zone of the second chamber. The depositing step is conducted in the third chamber with the substrate maintained at a temperature less than 100° C. At the same time, the Se vapor is recycled. The precursor is sealed into a graphite box and the substrates are rotated after selenization into an annealing chamber 22, the fabrication of the CIGS thin-films can be completed with the desired selenization profiles. The chalcogenization step is conducted in an annealing chamber with a temperature selected within the range of 100° C.-600° C. and the temperature is selected within the range of 250° C.-550° C. to create an absorber layer with a large grain size and crystalline structure.

The temperature of the Se vapor 14 is maintained generally between 220° C. and 450° C. Preferably, the temperature is maintained at 370° C. The carrier gas flow is preferably controlled at between 15 sccm and 45 sccm.

CIGS has been found to be one of the promising among the various candidates for the latest photovoltaic devices. In the present invention, we disclose a PECVD selenization method of low cost and time saving comparing to the conventional CVD selenization methods. The plasma chemically excites the Se molecules reaction activity which can speed up the deposition time. The films deposited at room temperature have qualities as good as those prepared at high temperature using other methods. By controlling the carrier gas flow and power of the plasma, optimized film compositions utilizing this invention can be formed.

Figure 2A:
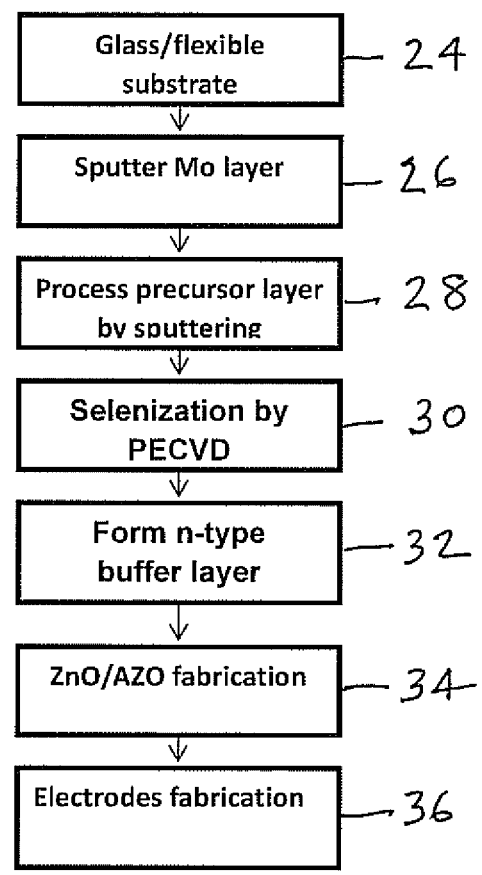
FIG. 2A is the flow chart of the method of the present invention.

Referring to FIG. 2A, the flow chart illustrates the method steps to implement the present invention. A glass or flexible substrate is provided, at 24, on which a layer of molybdenum (Mo) is spattered at 26. A pre-cursor layer is processed by spattering, at 28, followed by selenezation, at 30, by the plasma enhanced chemical vapor deposition (PECVD) system 10 illustrated in FIG. 1. Following selenezation an n-type buffer layer is formed, at 32, after which the compounds used to fabricate the electrodes, such as ZnO/AZO, are fabricated at 34 and the electrodes are fabricated at 36.

Figure 2B:
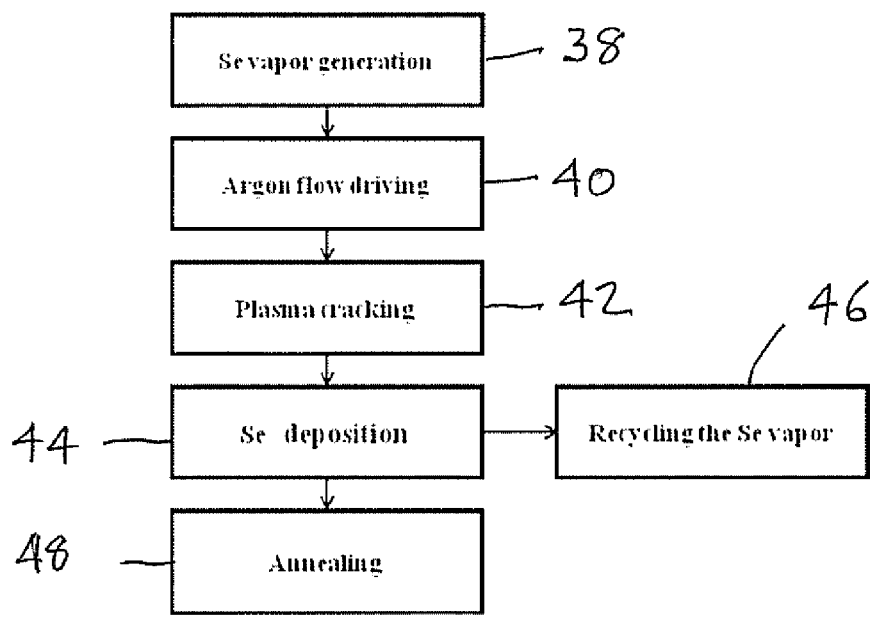
FIG. 2B is the flow chart describing the PECVD procedures in the method of the present method.

FIG. 2B illustrates the procedures followed in accordance with the present invention, as suggested by the discussion of the system diagram in FIG. 1. Thus, the Se vapor is generated within the crucible 13 at 38. The Se vapor is, as indicated at 40, moved to the RF chamber 16 by means of argon flow driving the Se vapor 14. Within the chamber 16 the resulting plasma is cracked, at 42, and the Se deposition then takes place within the deposition chamber 18, at step 44. As indicated, the Se vapor is recycled, at 46, by recycling device 20 and the deposited Se film is then annealed at 48 in the annealing chamber 22.

Figure 3:
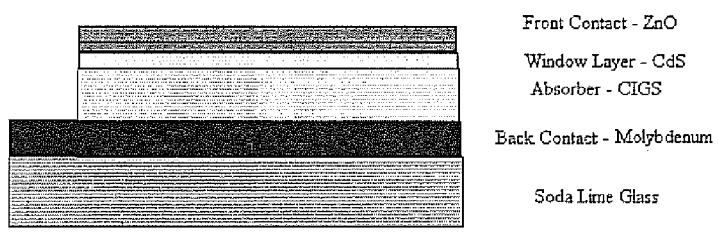
FIG. 3 is a graph illustrating a general structure of CIGS photovoltaic devices from the method of the present invention.
Figure 3A:
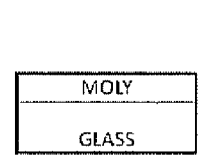
FIG. 3A-FIG. 3E are illustrations showing the fabrication of each layer of the method of the present invention.
Figure 3B:
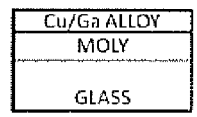
Figure 3C:
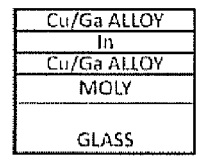
Figure 3D:
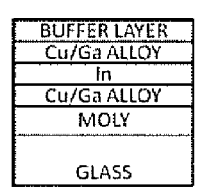
Figure 3E:
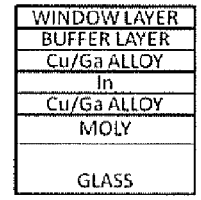

FIGS. 3-3E illustrate the fabrication steps as each layer of the method in the present invention is applied and the desired structure is formed. First, referring to FIG. 3A, a layer of Molybdenum ("Moly") is deposited on a glass substrate. In FIG. 3B a layer of Cu/Ga alloy is deposited on the Moly layer. In FIG. 3C an Indium layer "In" is deposited on the Cu/Ga alloy layer and another Cu/Ga alloy layer is deposited on the Indium layer. A buffer layer is deposited on the structure shown in FIG. 3C, as indicated in FIG. 3D, and FIG. 3E shows a window layer deposited on the buffer layer. FIG. 3 shows the resulting CIGS structure of a device formed in accordance with the steps outlined in FIGS. 3A-3E in which the Molybdenum layer forms a back contact while the zinc oxide ("ZnO") front contact window layer is deposited on top of the absorption layer. The buffer layer in the embodiment shown is formed of caldium sulfide CdS while the three top layers shown in FIG. 3C, making up the CIGS absorbing layer, is shown as a single layer. The compound semiconductor of chalcopyrite structure generally represented by the formula I-III-VI$_2$, wherein I represents an element in Group IB of the periodic table; wherein III refers to an element in Group IIIA of the periodic table; and wherein VI refers to an element in Group VIA of the periodic table. Each metallic I-III precursor layer comprises at least one of: Cu, In, and Ga, elements, and their combinations thereof. The metallic I-III precursor is selective for copper ratio. The metallic I-III precursor is selective for indium/gallium ratio. The VI powder comprises at least one of: Se, S elements, and their combinations.

Figure 4:
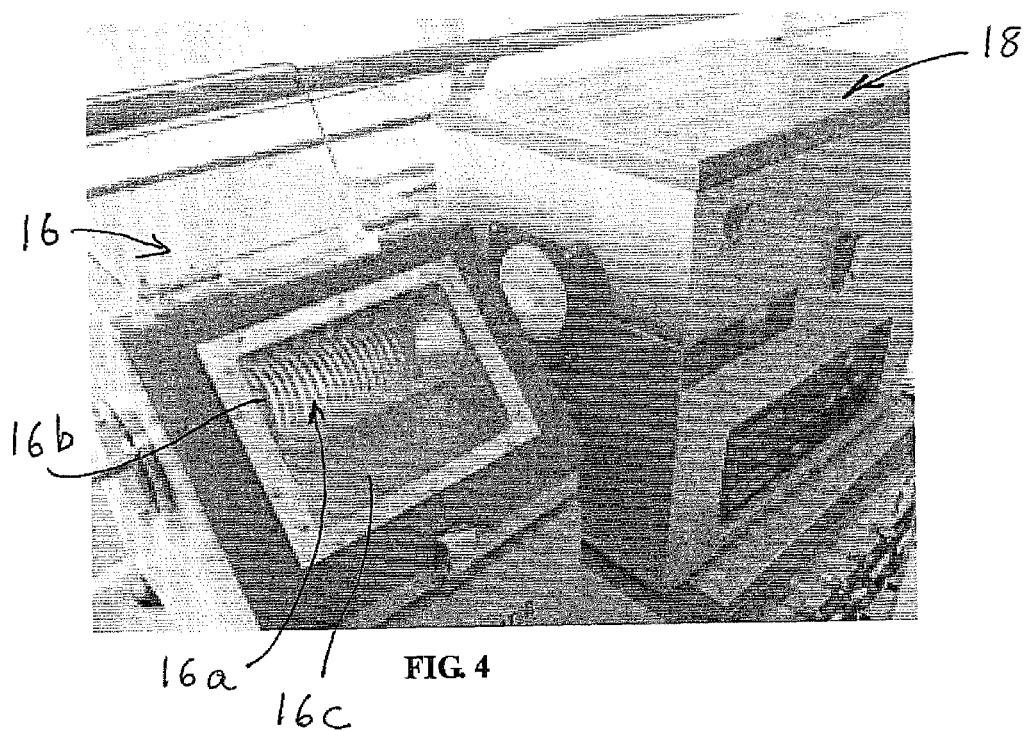
FIG. 4 is a photo of a PECVD facility, while showing operation practicing the method of the present invention.

FIG. 4 is a photograph of two important components of the PECVD facility in accordance with the present invention, shown while in operation. Illustrated at the lower left of FIG. 4 is an RF generator coil 16a outside a quartz tube 16b, visible through a glass panel 16c of the RF chamber 16 in FIG. 1, while the deposition chamber 18 is shown at the upper right of FIG. 4 where the Se vapor emanating from the RF chamber 16 is heated to a temperature of between 200 C.°-450 C.°, but preferably at approximately 370 C.°. The heated Se vapor is carried or transported to the deposition chamber by argon flow at 18'. The process gas comprises at least one of: Hydrogen, Argon, Nitrogen and their combinations. The heating step is conducted in the first chamber at a temperature in excess of 220° C. to produce VI vapor flux.

Figure 5:
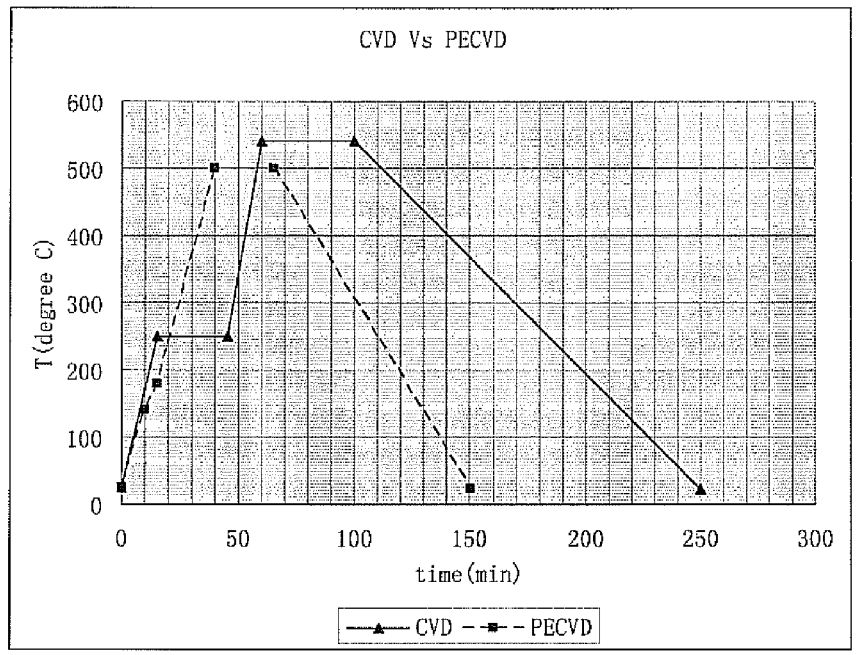
FIG. 5 is an image illustrating and comparing the selenization profiles between conventional CVD and the PECVD method of the present invention.

Referring to FIG. 5 a chart is illustrated comparing the selenization profiles between the products formed by conventional chemical vapor deposition (CVD) and PECVD in accordance with the present invention. It will be noted that when the temperature is increased to a temperature in excess of 220° C. the VI vapor flux is produced. FIG. 5 illustrates that the time to form the product in accordance with the present invention is considerably less than the time that it has taken to make product with the conventional chemical vapor deposition techniques.

Figure 6:
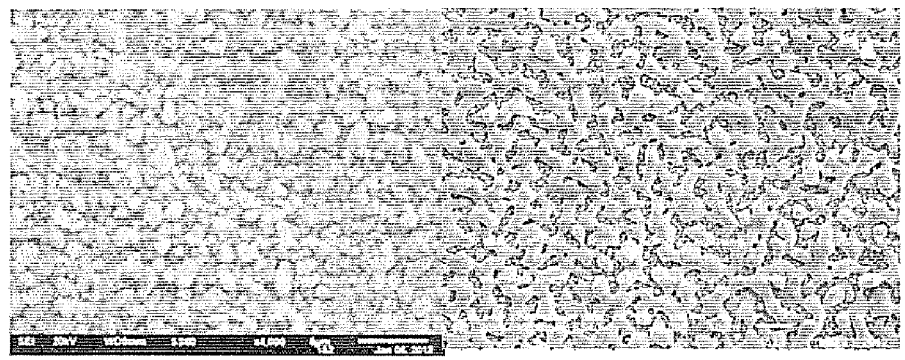
FIG. 6 is an image illustrating and comparing the surface structure before the selenization of the method of the present invention. Left side is for PECVD and right side is for CVD.

FIG. 6 shows two separate images taken under a scanning electron microscope (SEM), arranged side-by-side for comparison purposes. The left image shows the surface of a product made in accordance with the plasma enhanced chemical vapor deposition (PECVD) method of the present invention and shows the surface structures prior to selenization. With the RF used in accordance with the present invention the surface is substantially uniform and evenly distributed. The image on the right of FIG. 6 illustrates the surface resulting with the conventional chemical vapor deposition (CVD) method without the use of RF plasma cracking. The results are more grainy and less uniform than achievable with the invention as suggested on the left side.

Figure 7:
FIG. 7 is a graph illustrating and comparing the surface structure after the selenization of the method of the present invention. Left side is made by PECVD and right side is made by CVD.
Figure 8:
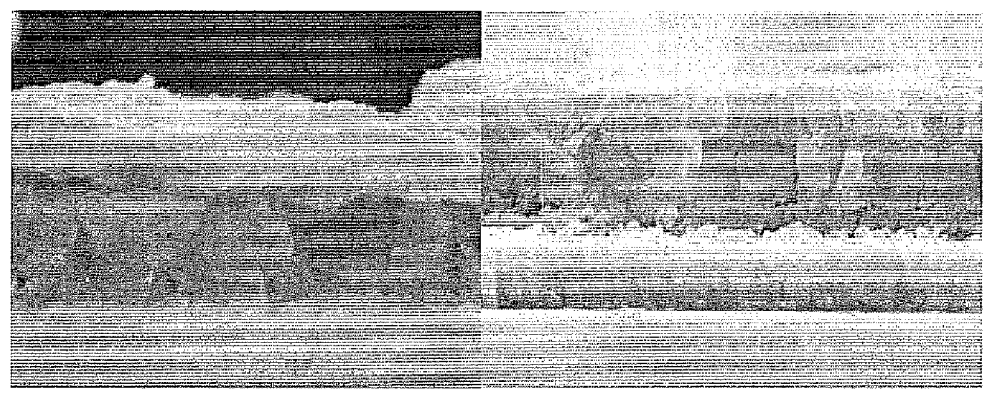
FIG. 8 illustrates and compares SEM pictures after the selenization of the method of the present invention. Left side is made by PECVD and right side is made by CVD.

FIG. 7 also illustrates side-by-side images for purposes of comparing the surface structures after selenization in accordance with the methods of the present invention and the conventional CVD method. The left side is made by the PECVD method and the right side is made by conventional CVD. To more fully appreciate FIG. 7 reference is also made to FIG. 8 that also shows side-by-side SEM photographs or images after the selenization of the present invention. The left side of FIG. 8 is made by PECVD in accordance with the invention while the right side is made by conventional CVD. In FIG. 7 the lighter image on the left side suggests a more uniform and active structure. The darker image on the right side indicates that the Se does not cover all of the apertures or spaces after selenization and, therefore, the result is less efficient and effective. Similarly, in FIG. 8, the image on the left side is made in accordance with the invention and illustrates a more uniform distribution or layer of the Se, covering the entire surface area while the image on the right does not show these results and, instead, indicates many voids or empty apertures resulting in an inferior product that is not as useful for the intended purposes.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A method of forming an I-III-VI$_2$ compound semiconductor thin film of chalcopyrite structure, the method comprising the steps: heating up elemental VI powder in a first chamber to produce VI vapor flux; introducing a process gas to effect flow of the VI vapor flux into a second chamber and utilizing a gas plasma to crack large molecular VI fractions to generate small molecule VI species, said process gas comprising at least one of: Hydrogen, Argon, Nitrogen and their combinations; depositing the small molecule VI species on a metallic I-III precursor layer at a temperature less than 100° C. to promote deposition of a homogeneous layer of said small molecule VI species on said precursor layer to form a I-III-VI$_2$ precursor layer; sealing said I-III-VI$_2$ precursor layer in an annealing chamber to create an absorber layer comprising said I-III-VI$_2$ compound semiconductor thin film, wherein said I-III-VI$_2$ compound semiconductor thin film comprises Cu(In,Ga)(S,Se)$_2$.

2. The method of claim 1, wherein said compound semiconductor structure generally represented by the formula I-III-VI$_2$, wherein I represents an element in Group IB of the periodic table; wherein III refers to an element in Group IIIA of the periodic table; and wherein VI refers to an element in Group VIA of the periodic table.

3. The method of claim 1, wherein said each metallic I-III precursor layer comprises at least one of: Cu, In, and Ga, elements, and their combinations thereof.

4. The method of claim 1, wherein said depositing step is conducted in a third chamber.

5. A method of forming an I-III-VI$_2$ compound semiconductor thin film of chalcopyrite structure, the method comprising the steps: heating up elemental VI powder in a first chamber to produce VI vapor flux; introducing a process gas to effect flow of the VI vapor flux into a second chamber and utilizing a gas plasma to crack large molecular VI fractions to generate small molecule VI species, said process gas comprising at least one of: Hydrogen, Argon, Nitrogen and their combinations; depositing the small molecule VI species on a metallic I-III precursor layer at a temperature less than 100° C. to promote deposition of a homogeneous layer of said small molecule VI species on said precursor layer to form a I-III-VI$_2$ precursor layer; sealing said I-III-VI$_2$ precursor layer into a graphite box; and transferring said I-III-VI$_2$ precursor layer to an annealing chamber to create an absorber layer comprising said I-III-VI$_2$ compound semiconductor thin film, wherein said I-III-VI$_2$ compound semiconductor thin film comprises Cu(In,Ga)(S,Se)$_2$.

6. The method of claim 5, wherein said each metallic I-III precursor layer comprises at least one of Cu, In, and Ga, elements, and their combinations thereof.

7. The method of claim 5 wherein metallic I-III precursor having a selected ratio of copper.

8. The method of claim 5 wherein metallic I-III precursor having a selected ratio of indium/gallium.

9. The method of claim 5, wherein said VI powder comprises at least one of: Se, S elements, and their combinations.

10. The method of claim 5, wherein said heating step is conducted in the first chamber at a temperature in excess of 220° C. to produce VI vapor flux.

11. The method of claim 5, wherein said cracking step is conducted in the second chamber at a temperature in excess of 200° C.

12. The method of claim 11, wherein said plasma is applied with a frequency in excess of 30 KHz.

13. The method of claim 11, wherein a pressure in excess of 100 mTorr is maintained in the reaction zone of the second chamber.

14. The method of claim 5, wherein said depositing step is conducted in a third chamber.

15. The method of claim 5 wherein a chalcogenization step is conducted in an annealing chamber with a temperature selected from the range of 100° C.-600° C.

16. The method of claim 15, wherein said temperature is selected within the range of 250° C.-550° C.

17. A method of forming an I-III-VI$_2$ compound semiconductor thin film of chalcopyrite structure, the method comprising the steps: heating up elemental VI powder in a first chamber to produce VI vapor flux; introducing a process gas to effect flow of the VI vapor flux into a second chamber and utilizing a gas plasma to crack large molecular VI fractions to generate small molecule VI species, said process gas comprising at least one of: Hydrogen, Argon, Nitrogen and their combinations; depositing the small molecule VI species on a metallic I-III precursor layer at a temperature less than 100° C. to promote deposition of a homogeneous layer of said small molecule VI species on said precursor layer to form a I-III-VI$_2$ precursor layer; sealing said I-III-VI$_2$ precursor layer in an annealing chamber at an annealing temperature having a ramping rate with the range of approximately 0.2-0.5° C./sec to create an absorber layer comprising said I-III-VI$_2$ compound semiconductor thin film, wherein said compound semiconductor thin film comprises Cu(In,Ga)(S,Se)$_2$.

* * * * *